(12) United States Patent
Son et al.

(10) Patent No.: US 9,246,468 B2
(45) Date of Patent: Jan. 26, 2016

(54) BULK ACOUSTIC WAVE RESONATOR AND MANUFACTURING METHOD THEREOF, AND RADIO FREQUENCY DEVICE USING BULK ACOUSTIC WAVE RESONATOR

(75) Inventors: Sang Uk Son, Yongin-si (KR); Duck Hwan Kim, Goyang-si (KR); Chul Soo Kim, Hwaseong-si (KR); Ho Soo Park, Yongin-si (KR); In Sang Song, Osan-si (KR); Jea Shik Shin, Hwaseong-si (KR); Moon Chul Lee, Seongnam-si (KR); Jing Cui, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 516 days.

(21) Appl. No.: 13/592,821

(22) Filed: Aug. 23, 2012

(65) Prior Publication Data
US 2013/0147320 A1 Jun. 13, 2013

(30) Foreign Application Priority Data
Dec. 8, 2011 (KR) ........................ 10-2011-0130902

(51) Int. Cl.
H03H 9/02 (2006.01)
H03H 9/17 (2006.01)
H03H 9/10 (2006.01)
H03H 9/56 (2006.01)
H03H 9/58 (2006.01)

(52) U.S. Cl.
CPC ....... *H03H 9/02102* (2013.01); *H03H 9/02149* (2013.01); *H03H 9/1014* (2013.01); *H03H 9/173* (2013.01); *H03H 9/564* (2013.01); *H03H 9/587* (2013.01); *Y10T 29/42* (2015.01)

(58) Field of Classification Search
CPC ....... H03H 9/177; H03H 9/0207; H03H 3/04; H01L 41/053
USPC ............ 310/320, 324, 340, 346, 347, 348
See application file for complete search history.

(56) References Cited

U.S. PATENT DOCUMENTS

| 7,323,953 | B2 | 1/2008 | Yokoyama et al. |
| 7,622,846 | B2 | 11/2009 | Song et al. |
| 7,965,156 | B2 | 6/2011 | Ward et al. |
| 8,610,333 | B2 * | 12/2013 | Pang .................... H03H 9/0095 310/313 R |
| 2007/0063622 | A1 * | 3/2007 | Rudy ..................... H03H 3/04 310/341 |

(Continued)

FOREIGN PATENT DOCUMENTS

| JP | 2005-073175 A | 3/2005 |
| JP | 2006-033450 A | 2/2006 |
| KR | 10-2003-0008057 A | 1/2003 |
| KR | 10-0622955 B1 | 9/2006 |
| KR | 10-2008-0102888 A | 11/2008 |
| KR | 10-2009-0032437 A | 4/2009 |

OTHER PUBLICATIONS

International Search Report issued Feb. 20, 2013 in International Patent Application No. PCT/KR2012/006833 (3 pages, in English).

(Continued)

*Primary Examiner* — Shawki S Ismail
*Assistant Examiner* — Bryan Gordon
(74) *Attorney, Agent, or Firm* — NSIP Law

(57) ABSTRACT

Provided is a bulk acoustic wave resonator (BAWR). The BAWR may include a first electrode, a piezoelectric layer disposed on the first electrode, a second electrode disposed on the piezoelectric layer. In various aspects, at least one of the first electrode, the piezoelectric layer, and the second electrode are formed of a carbon-based material.

19 Claims, 4 Drawing Sheets

(56) References Cited

U.S. PATENT DOCUMENTS

| | | | |
|---|---|---|---|
| 2007/0085631 A1 | 4/2007 | Larson, III et al. | |
| 2007/0120625 A1 | 5/2007 | Larson, III et al. | |
| 2008/0079516 A1* | 4/2008 | Ruby et al. | 333/189 |
| 2008/0309432 A1* | 12/2008 | Fattinger | H03H 3/04 333/189 |
| 2009/0045704 A1* | 2/2009 | Barber | H03H 9/131 310/364 |
| 2010/0171393 A1* | 7/2010 | Pei | H01L 41/084 310/330 |
| 2011/0146041 A1* | 6/2011 | Miyake et al. | 29/25.35 |
| 2011/0204995 A1* | 8/2011 | Jamneala | H03H 9/587 333/187 |

OTHER PUBLICATIONS

Garcia-Gancedo, L., et al. "Fabrication of high-Q film bulk acoustic resonator (FBAR) filters with carbon nanotube (CNT) electrodes." *Ultrasonics Symposium (IUS), 2010 IEEE.* (4 pages in English).

Dragoman, Mircea, et al. "High performance thin film bulk acoustic resonator covered with carbon nanotubes." *Applied physics letters* 89.14 (2006): 143122. (4 pages in English).

Extended Eureopean Search Report issued by the European Patent Office on Jun. 12, 2015, for the corresponding European Patent Application No. 12854657.9 (11 pages in English).

* cited by examiner

BULK ACOUSTIC WAVE RESONATOR AND MANUFACTURING METHOD THEREOF, AND RADIO FREQUENCY DEVICE USING BULK ACOUSTIC WAVE RESONATOR

CROSS-REFERENCE TO RELATED APPLICATION(S)

This application claims the benefit under 35 USC §119(a) of Korean Patent Application No. 10-2011-0130902, filed on Dec. 8, 2011, in the Korean Intellectual Property Office, the entire disclosure of which is incorporated herein by reference for all purposes.

BACKGROUND

1. Field

The following description relates to a bulk acoustic wave resonator (BAWR).

2. Description of Related Art

A bulk acoustic wave resonator (BAWR) includes electrodes that are typically disposed on and/or below a piezoelectric layer. In response to a high frequency signal being applied to the electrodes, the piezoelectric layer may oscillate.

The BAWR may be used for a wireless signal transferring system. For example, the BAWR may be used in a wireless communication device, a wireless power transmitter, a filter of a wireless sensor, a transmitter, a receiver, a duplexer, and the like. As another example, the BAWR may be used for input and/or output of wireless data.

Studies on a radio frequency (RF) device that may secure a low power and a high speed are being conducted. Accordingly, a BAWR that may be used in such low power and high speed device is desirable.

SUMMARY

In an aspect, there is provided a bulk acoustic wave resonator (BAWR), including a membrane disposed on an air cavity, a first electrode disposed on the membrane, a piezoelectric layer disposed on the first electrode, and a second electrode disposed on the piezoelectric layer, wherein at least one of the first electrode, the piezoelectric layer, and the second electrode comprise a carbon-based material.

The carbon-based material may comprise a carbon nano tube (CNT), a CNT compound, graphene, and a graphene compound.

The graphene may be disposed as a single layer or a multilayer.

The BAWR may further comprise a protective layer that is disposed on the second electrode to protect the second electrode from an external environment.

The BAWR may further comprise a temperature coefficient of frequency (TCF) compensation layer to compensate for a TCF of the first electrode, the piezoelectric layer, and the second electrode, wherein the TCF compensation layer comprises a carbon-based material.

The TCF compensation layer may be disposed below the membrane or on the second electrode.

The TCF compensation layer may be disposed between the first electrode and the membrane.

The BAWR may further comprise an insulating layer that is disposed between the first electrode and the TCF compensation layer to separate electrical characteristics of the first electrode and the TCF compensation layer.

The BAWR may further comprise an insulating layer that is disposed between the second electrode and the TCF compensation layer to separate electrical characteristics of the second electrode and the TCF compensation layer.

The BAWR may further comprise a TCF compensation layer to compensate for a TCF of the first electrode, the piezoelectric layer, and the second electrode, wherein the TCF compensation layer comprises a carbon-based material and is disposed on or below the protective layer.

In an aspect, there is provided a radio frequency (RF) device including a bulk acoustic wave resonator (BAWR), the RF device including a first substrate, a first BAWR comprising a first air cavity formed on the first substrate, and a first lower portion electrode, a first piezoelectric layer, and a first upper portion electrode which are layered on the first air cavity, and a second BAWR comprising a second air cavity formed on the first substrate, and a second lower portion electrode, a second piezoelectric layer, and a second upper portion electrode which are layered on the second air cavity, wherein at least one of the first lower portion electrode, the first piezoelectric layer, the first upper portion electrode, the second lower portion electrode, the second piezoelectric layer, and the second upper portion electrode comprises a carbon-based material.

The carbon-based material may comprise a carbon nano tube (CNT), a CNT compound, graphene, and a graphene compound.

The RF device may further comprise a second substrate comprising an air cavity formed on a predetermined area of a lower surface and connected to the first substrate.

The RF device may further comprise a protective layer layered below the via-holes and the first substrate, and a package electrode layered below the protective layer.

The package electrode may comprise at least one of a CNT, a CNT compound, graphene, and a graphene compound.

The RF device may further comprise via-holes formed at locations on the first substrate, the locations corresponding to a predetermined area of the first lower portion electrode and a predetermined area of the second upper portion electrode.

The RF device may further comprise a package electrode layered below the via-holes and the first substrate, wherein the first substrate has a high resistance characteristic, and a protective layer layered below the package electrode.

The protective layer may comprise at least one of a carbon nano tube (CNT), a CNT compound, graphene, and a graphene compound.

In an aspect, there is provided a method of manufacturing a bulk acoustic wave resonator (BAWR), the method including layering a silicon oxide layer, a silicon nitride layer, and a sacrificial layer sequentially on a substrate, patterning the sacrificial layer to correspond to a shape of an air cavity, layering a silicon oxide layer, a silicon nitride layer, and a first conductive layer, sequentially on the patterned sacrificial layer, patterning a first electrode on the first conductive layer, layering a piezoelectric layer and a second conductive layer, sequentially on the first electrode, patterning a second electrode on the second conductive layer, layering a protective layer on the second electrode, and forming the air cavity by removing the sacrificial layer based on the patterning of the sacrificial layer, and forming via-holes by etching locations on the substrate, the locations corresponding a predetermined area of the first electrode and a predetermined area of the second electrode, wherein at least one of the first conductive layer, the piezoelectric layer, and the second conductive layer comprises a carbon-based material.

The method may further comprise evaporating a protective layer below the via-holes, evaporating, below the protective layer, a conductive layer formed of a carbon-based material, and forming an electrode pad by patterning the conductive layer.

The method may further comprise evaporating, below the via-holes, a conductive layer formed of a carbon-based material, wherein the substrate has a high resistance characteristic, and forming an electrode pad by patterning the conductive layer.

Other features and aspects may be apparent from the following detailed description, the drawings, and the claims.

Figure 1:
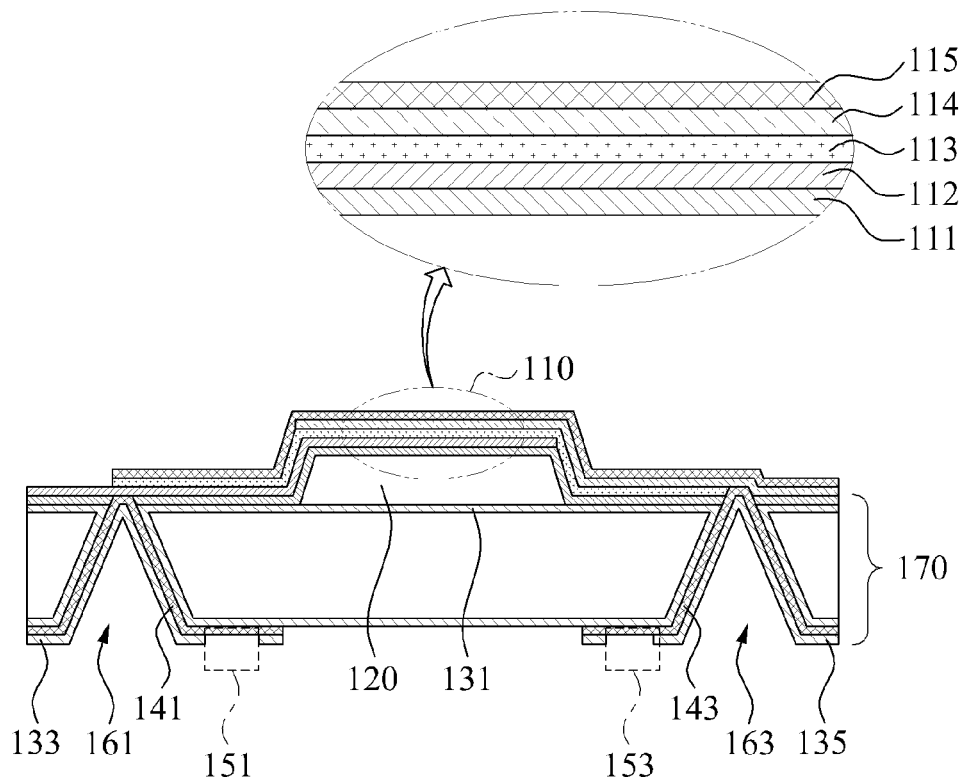
FIG. 1 is a diagram illustrating a cross-sectional view of an example of a bulk acoustic wave resonator (BAWR).

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Accordingly, various changes, modifications, and equivalents of the methods, apparatuses, and/or systems described herein may be suggested to those of ordinary skill in the art. Also, descriptions of well-known functions and constructions may be omitted for increased clarity and conciseness.

A BAWR may be used as a filter, a transmitter, a receiver, a duplexer, and the like, for input and output of wireless data in a wireless communication device. The number of types of wireless devices is increasing, and thus, a number of fields to which the BAWR may be applied is expanding. For example, the BAWR may be included in a terminal such as a mobile phone, a computer, a tablet, a sensor, an appliance, and the like.

The BAWR may induce oscillation or waves of a predetermined frequency using resonance. For example, the BAWR may be used as a component in a radio frequency (RF) device, such as, a filter and an oscillator.

In various examples, a BAWR may be levitated above a substrate through an air cavity to improve an acoustic wave reflection characteristic. For a BAWR that has a frequency band-pass characteristic, a plurality of resonators may be disposed on a plane and the resonators may be connected to a common electrode to improve a reflection characteristic or transmission characteristic within a frequency band range.

A material used for an electrode of the BAWR may have a high acoustic wave propagation speed, a low electric resistance, a slight change in a heat characteristic, and the like. Accordingly, metals such as molybdenum (Mo), ruthenium (Ru), gold (Au), and the like, may be used for the electrode.

For example, an electrode included in a BAWR may be manufactured to be a few thousands angstroms thick, based on a designed frequency and a characteristic of the BAWR. As a thickness of the electrode is increased, an electric resistance is reduced. However, as an acoustic wave propagation speed increases, a loss of power may subsequently increase. If an ambient temperature of the BAWR changes, a physical property of each layer including the electrode may change and thus, a heat characteristic may be deteriorated.

The BAWR may utilize an electrode, a piezoelectric layer, and a temperature coefficient of frequency (TCF) compensation layer. In various aspects herein, one or more of the electrode, the piezoelectric layer, and the TCF compensation layer may be formed of a carbon-based material. For example, the carbon-based material may include a carbon nano tube (CNT), a CNT compound, graphene, a graphene compound, and the like.

FIG. 1 illustrates a cross-sectional view of an example of a BAWR.

Referring to FIG. 1, the BAWR includes a bulk acoustic wave resonance unit 110, an air cavity 120, a protective layer 131, a via-hole 161, a via-hole 163, and a substrate 170.

In this example, the bulk acoustic resonance unit 110 includes a first electrode 112, a piezoelectric layer 113, and a second electrode 114. The piezoelectric layer 113 is disposed between the first electrode 112 and the second electrode 114. The BAWR 110 may enable resonance in the piezoelectric layer 113 based on a signal applied to the first electrode 112 and the second electrode 113, to generate a resonant frequency and an anti-resonant frequency.

The bulk acoustic resonance unit 110 may use an acoustic wave of a piezoelectric material. For example, if an RF signal is applied to the piezoelectric material, mechanical oscillation may occur in a direction of a thickness of a piezoelectric film so that an acoustic wave may be generated. For example, the piezoelectric material may include zinc oxide (ZnO), aluminum nitride (AlN), quartz, and the like.

Resonance may occur when half of a wavelength of the applied RF signal is equal to a thickness of a piezoelectric film. In response to the resonance occurring, an electrical impedance of the BAWR may change sharply. In this example, the BAWR may be utilized as a filter to select a frequency. For example, a resonant frequency may be determined based on a thickness of a piezoelectric film, an electrode enclosing the piezoelectric film, and an intrinsic elastic wave speed of the piezoelectric film, and the like. The resonant frequency may increase as the thickness of the piezoelectric film becomes thinner.

In various aspects herein, at least one of the first electrode 112, the piezoelectric layer 113, and the second electrode 114 may be formed of a carbon-based material. For example, at least one of the first electrode 112, the piezoelectric layer 113, and the second electrode 114 may include CNT, graphene, a CNT compound, a graphene compound, and the like. The graphene may be used as a single layer or a multi-layer.

As an example, the first electrode 112 may be formed of a carbon-based material or may be formed of a material such as ZnO, AlN, quartz, and the like. The second electrode 114 may be formed of a metal, for example, Mo, Ru, Al, platinum (Pt), titanium (Ti), tungsten (W), palladium (Pd), chromium (Cr), nickel (Ni), and the like.

The CNT may include a three-dimensional (3D) honeycomb-shaped structure in which carbon atoms are connected to each other in a hexagonal arrangement, and which are formed of a film having a thickness in the range of atomic units of length, and having a high conductivity and a high mechanical strength.

As another example, graphene may include a two-dimensional (2D) honeycomb shaped structure in which carbon atoms are connected to each other in a hexagonal arrangement, and which are formed by a film having a thickness in the range of atomic units of length.

Referring again to FIG. 1, the first electrode 112 is disposed on a membrane 111. The membrane 111 is disposed on the air cavity 120. In this example, the membrane 111 may maintain a shape of the air cavity 120. The membrane 111 supports a structure of the bulk acoustic wave resonance unit 110.

A reflection of an acoustic wave generated from the bulk acoustic wave resonance unit 110 may be improved through use of the air cavity 120. For example, because an impedance of the air cavity 120 is substantially infinite, the acoustic wave may not be lost in the air cavity 120, and thus, may remain in the bulk acoustic resonance unit 110.

The air cavity 120 may be formed inside the substrate 170, for example, by etching, or may be formed on the substrate 170 using a sacrificial layer patterned to correspond to the shape of the air cavity 120.

The bulk acoustic wave resonance unit 110 also includes a protective layer 115. The protective layer 115 is disposed on the second electrode 114, so as to protect the second electrode 114 from being exposed to an external environment. The protective layer 115 may be formed of an insulating material. Examples of the insulating material include a silicon oxide-based material, a silicon nitride-based material, an AlN-based material, and the like. The protective layer 115 may be utilized for adjusting a resonant frequency.

The other protective layer 131 may be used to prevent the substrate 170 from being damaged during a process of generating the air cavity 120. For example, the air cavity 120 may be formed by removing the sacrificial layer through gas which is injected through a release hole (not illustrated). In this example, the protective layer 131 may prevent the substrate 170 from being damaged by the injected gas.

The via-hole 161 and the via-hole 163 are formed at areas of the substrate 170, respectively. The via-hole 161 may penetrate the substrate 170 and may be used as a path through which the first electrode 112 is connected to an external electrode. The first electrode 112 may be connected to the external electrode through a conductive layer 141 layered on the via-hole 161. For example, the first electrode 112 may be connected to the external electrode through an electrode pad 151 of the conductive layer 141. An external signal may be applied from the external electrode to the first electrode 112. Accordingly, a signal output from the first electrode 112 may be transferred to the external electrode through the electrode pad 151.

The via-hole 163 may penetrate the substrate 170 and may be used as a path through which the second electrode 114 is connected to an external electrode. The second electrode 114 may be connected to the external electrode through a conductive layer 143 layered on the via-hole 163. For example, the second electrode 114 may be connected to the external electrode through an electrode pad 153 of the conductive layer 143. An external signal may be applied from the external electrode to the second electrode 114. Accordingly, a signal output from the second electrode 114 may be transferred to the external electrode through the electrode pad 153.

In various examples, the substrate 170 may be formed of silicon or poly-silicon.

A protective layer 133 may be formed as an insulating material on the conductive layer 141 so as to expose only a predetermined area of the electrode pad 151 to an external environment. A protective layer 135 may be formed as an insulating material on the conductive layer 143 so as to expose only a predetermined area of the electrode pad 153. For example, at least one of the conductive layer 141, the conductive layer 143, the protective layer 133, and the protective layer 135 may be formed of a carbon-based material.

A BAWR manufacturing method may layer a silicon-oxide film, a silicon-nitride film, and a sacrificial layer, sequentially on the substrate 170. A sacrificial material used for the sacrificial layer may include poly-silicon and a polymer. The silicon-oxide film and the silicon-nitride film may be used for forming the protective layer 131.

The BAWR manufacturing method may pattern the sacrificial layer to correspond to the shape of the air cavity 120. For example, the shape of the air cavity 120 may be set based on a characteristic of the BAWR.

The BAWR manufacturing method may layer a silicon-oxide film, a silicon-nitride film, and a first conductive layer, sequentially on the patterned sacrificial layer. Here, the silicon-oxide film and the silicon-nitride film may be used for forming the membrane 111. In this example, a carbon-based material may be used for forming the first conductive layer.

The BAWR manufacturing method may pattern the first electrode 112 on the first conductive layer. The BAWR manufacturing method may layer the piezoelectric layer 113 and a two conductive layer, sequentially on the first electrode 112. In this example, a carbon-based material may be used for forming the piezoelectric layer 113 or the second conductive layer. The BAWR manufacturing method may pattern the second electrode 114 on the second conductive layer. The BAWR manufacturing method may layer the protective layer 115 on the second electrode 114.

As another example, the BAWR manufacturing method may form the air cavity 120 by removing the sacrificial layer through the use of a release hole based on the patterning of the sacrificial layer.

The BAWR manufacturing method may etch locations on lower surfaces of the substrate 170, the locations corresponding to a predetermined area of the first electrode 112 and a predetermined area of the second electrode 114, and may form the via-hole 161 and the via-hole 163. Accordingly, the first electrode 112 and the second electrode 114 may be connected to an external electrode.

The BAWR manufacturing method may evaporate the protective layers 133 and 135 below the via-hole 161 and the via-hole 163, and may evaporate the conductive layers 141 and 143 formed of a carbon-based material below the protective layer 131. The BAWR manufacturing method may pattern the conductive layers 141 and 143 so as to form the electric pads 151 and 153, respectively.

The BAWR manufacturing method may evaporate the protective layers 133 and 135 below the conductive layers 141 and 143, respectively. The BAWR manufacturing method may evaporate the conductive layers 141 and 143 formed of a carbon-based material below the via-holes 161 and 163, respectively, when the substrate 170 has a high resonance characteristic. Subsequently, the BAWR manufacturing method may pattern the conductive layers 141 and 143 so as to form the electrode pads 151 and 153, respectively.

In various examples, the substrate 170 may have a high resonance characteristic when the substrate 170 is formed of poly-silicon.

Figure 2:
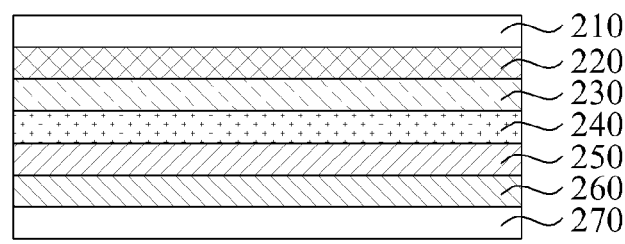
FIG. 2 is a diagram illustrating an example of a BAWR.

FIG. 2 illustrates an example of a BAWR.

As described herein, TCF denotes a variance in a resonant frequency within a temperature range in which the BAWR is used. If a value of the TCF is close to zero, the variance in frequency may be negligible.

Referring to FIG. 2, the BAWR includes a TCF compensation layer 210, a protective layer 220, a second electrode 230, a piezoelectric layer 240, a first electrode 250, a membrane 260, and a TCF compensation layer 270.

In this example, the TCF compensation layer 210 and the TCF compensation layer 270 may be formed of a carbon-based material. As an example, the TCF compensation layer 210 may be formed of CNT, and the TCF compensation layer 270 may be formed of a CNT compound. The TCF compensation layer 210 and the TCF compensation layer 270 may compensate for TCFs of the protective layer 220, the second electrode 230, the piezoelectric layer 240, the first electrode 250, and/or the membrane 260. For example, at least one of the second electrode 230, the piezoelectric layer 240, and the first electrode 250 may be formed of a carbon-based material.

The TCF compensation layer 210 and the TCF compensation layer 270 may balance the TCFs of the second electrode 230, the piezoelectric layer 240, the first electrode 250, and the membrane 260. For example, the TCF compensation layers may enable a TCF of the BAWR to be close to zero. For example, the TCF compensation layers may compensate for the TCFs of the electrodes, piezoelectric layers, membranes, and the like, of the BAWR such that the BAWR has an overall TCF of approximately zero.

In the example of FIG. 2, the TCF compensation layer 210 is disposed on the protective layer 220. As another example, the TCF compensation layer 210 may be disposed below the protective layer 220. Referring to FIG. 2, the TCF compensation layer 270 is disposed below the membrane 260. However, the TCF compensation layer 270 may be disposed on the membrane 260.

Figure 3:
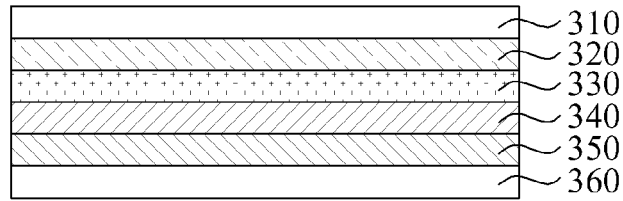
FIG. 3 is a diagram illustrating another example of a BAWR.

FIG. 3 illustrates another example of a BAWR.

Referring to FIG. 3, the BAWR includes a TCF compensation layer 310, a second electrode 320, a piezoelectric layer 330, a first electrode 340, a membrane 350, and a TCF compensation layer 360.

For example, the TCF compensation layer 310 and the TCF compensation layer 360 may be formed of a carbon-based material. As an example, the TCF compensation layer 310 may be formed of graphene, and the TCF compensation layer 360 may be formed of a graphene compound. The TCF compensation layer 310 and the TCF compensation layer 360 may compensate for TCFs of the second electrode 320, the piezoelectric layer 330, the first electrode 340, and/or the membrane 350. For example, at least one of the second electrode 320, the piezoelectric layer 330, and the first electrode 340 may be formed of a carbon-based material.

The TCF compensation layer 310 and the TCF compensation layer 360 may balance the TCFs of the second electrode 320, the piezoelectric layer 330, the first electrode 340, and the membrane 350. For example, the TCF compensation layers may enable a TCF of the BAWR to be close to zero.

Although FIG. 3 illustrates that the TCF compensation layer 310 is disposed on the second electrode 320, the TCF compensation layer 310 may be disposed below the second electrode 320. Although FIG. 3 illustrates that the TCF compensation layer 360 is disposed below the membrane 350, the TCF compensation layer 360 may be disposed on the membrane 350 or may be on the first electrode 340.

Figure 4:
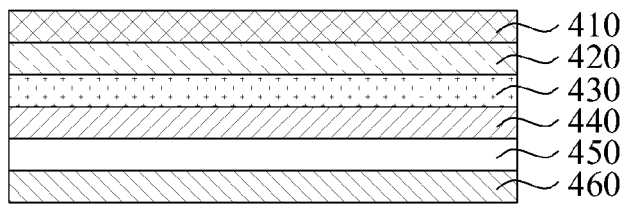
FIG. 4 is a diagram illustrating another example of a BAWR.

FIG. 4 illustrates another example of a BAWR.

Referring to FIG. 4, the BAWR includes a protective layer 410, a second electrode 420, a piezoelectric layer 430, a first electrode 440, a TCF compensation layer 450, and a membrane 460.

For example, the TCF compensation layer 450 may be formed of a carbon-based material. For example, the TCF compensation layer 450 may be formed of a graphene compound. The TCF compensation layer 450 may compensate for TCFs of the second electrode 420, the piezoelectric layer 430, the first electrode 440, and/or the membrane 460. For example, at least one of the second electrode 420, the piezoelectric layer 430, and the first electrode 440 may be formed of a carbon-based material.

The TCF compensation layer 450 may be included between layers of materials that constitute the BAWR. As another example, the TCF compensation layer 450 may be formed to be in contact with the layers of a material that constitutes the BAWR so as to be balanced with respect to the TCFs of the protective layer 410, the second electrode 420, the piezoelectric layer 430, the first electrode 440, and the membrane 460. Accordingly, a TCF of the BAWR may be close to zero.

Although FIG. 4 illustrates that the TCF compensation layer 450 is disposed on the membrane 460, the TCF compensation layer 450 may be disposed on or below the protective layer 410, disposed on or below the second electrode 420, disposed on or below the piezoelectric layer 430, disposed on or below the first electrode 440, or disposed below the membrane 460.

Figure 5:
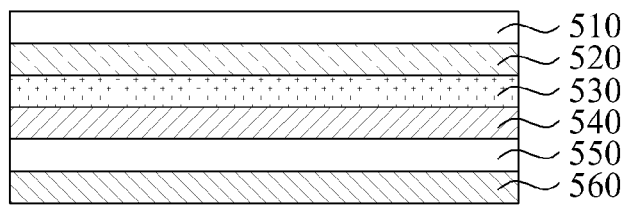
FIG. 5 is a diagram illustrating another example of a BAWR.

FIG. 5 illustrates another example of a BAWR.

Referring to FIG. 5, the BAWR includes a TCF compensation layer 510, a second electrode 520, a piezoelectric layer 530, a first electrode 540, a TCF compensation layer 550, and a membrane 560.

For example, the TCF compensation layer 510 and the TCF compensation layer 550 may be formed of a carbon-based material. As an example, the TCF compensation layer 510 may be formed of CNT, and the TCF compensation layer 550 may be formed of graphene. The TCF compensation layer 510 and the TCF compensation layer 550 may compensate for TCFs of the second electrode 520, the piezoelectric layer 530, the first electrode 540, and/or the membrane 560. For example, at least one of the second electrode 520, the piezoelectric layer 530, and the first electrode 540 may be formed of a carbon-based material.

The TCF compensation layer 510 and the TCF compensation layer 550 may balance the TCFs of the second electrode 520, the piezoelectric layer 530, the first electrode 540, and the membrane 560 and thus, may enable a TCF of the BAWR to be close to zero.

Although FIG. 5 illustrates that the TCF compensation layer 510 is disposed on the second electrode 520, the TCF compensation layer 510 may be disposed below the second electrode 520. Although FIG. 5 illustrates that the TCF compensation layer 550 is disposed on the membrane 560, the TCF compensation layer 550 may be disposed below the membrane 560, or may be disposed on the first electrode 540.

Figure 6:
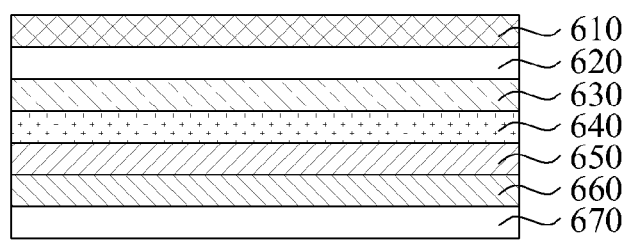
FIG. 6 is a diagram illustrating another example of a BAWR.

FIG. 6 illustrates another example of a BAWR.

Referring to FIG. 6, the BAWR includes a protective layer 610, a TCF compensation layer 620, a second electrode 630, a piezoelectric layer 640, a first electrode 650, a membrane 660, and a TCF compensation layer 670.

For example, the TCF compensation layer 620 and the TCF compensation layer 670 may be formed of a carbon-based material. As an example, the TCF compensation layer 620 may be formed of graphene, and the TCF compensation layer 670 may be formed of a CNT compound.

The TCF compensation layer 620 and the TCF compensation layer 670 may compensate for TCFs of the protective layer 610, the second electrode 630, the piezoelectric layer 640, the first electrode 650, and/or the membrane 660. In this example, at least one of the second electrode 630, the piezoelectric layer 640, and the first electrode 650 may be formed of a carbon-based material.

The TCF compensation layer 620 and the TCF compensation layer 670 may balance the TCFs of the second electrode 630, the piezoelectric layer 640, the first electrode 650, and the membrane 660, and thus, may enable a TCF of the BAWR to be close to zero.

Although FIG. 6 illustrates that the TCF compensation layer 620 is disposed below the protective layer 610, the TCF 620 may be disposed on the protective layer 610. Although FIG. 6 illustrates that the TCF compensation layer 670 is disposed below the membrane 660, the TCF may be disposed on the membrane 660.

Figure 7:
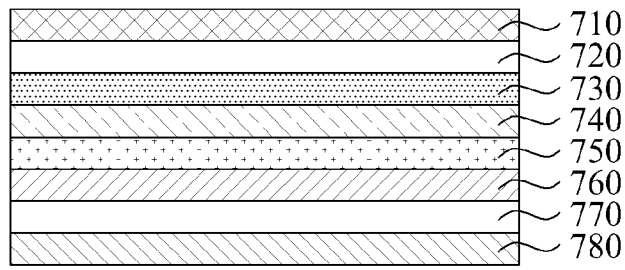
FIG. 7 is a diagram illustrating another example of a BAWR.

FIG. 7 illustrates another example of a BAWR.

Referring to FIG. 7, the BAWR includes a protective layer 710, a TCF compensation layer 720, an insulating layer 730, a second electrode 740, a piezoelectric layer 750, a first electrode 760, a TCF compensation layer 770, and a membrane 780.

For example, the TCF compensation layer 720 and the TCF compensation layer 770 may be formed of a carbon-based material. As an example, the TCF compensation layer 720 may be formed of a graphene compound, and the TCF compensation layer 770 may be formed of a CNT compound.

When the TCF compensation layer 720 has an electrical characteristic of a conductor due to an applied RF signal, the TCF compensation layer 720 may affect the second electrode 740 when the TCF compensation layer 720. In this example, the insulating layer 730 is disposed between the second electrode 740 and the TCF compensation layer 720, so as to separate electrical characteristics of the second electrode 740 and the TCF compensation layer 720. The insulating layer 730 may be formed of a silicon oxide-based material, a silicon nitride-based material, an aluminum nitride-based material, and the like.

The TCF compensation layer 720 and the TCF compensation layer 770 may compensate for TCFs of the protective layer 710, the second electrode 740, the piezoelectric layer 750, the first electrode 760, and/or the membrane 780. In this example, at least one of the second electrode 740, the piezoelectric layer 750, and the first electrode 760 may be formed of a carbon-based material.

The TCF compensation layer 720 and the TCF compensation layer 770 may balance the TCFs of the second electrode 740, the piezoelectric layer 750, the first electrode 760, and the membrane 780, and thus, may enable a TCF of the BAWR to be close to zero.

Although FIG. 7 illustrates that the TCF compensation layer 720 is disposed below the protective layer 710, the TCF compensation layer 720 may be disposed on the protective layer 710. Although FIG. 7 illustrates that the TCF compensation layer 770 is disposed on the membrane 780, the TCF compensation layer 770 may be disposed below the membrane 780.

Figure 8:
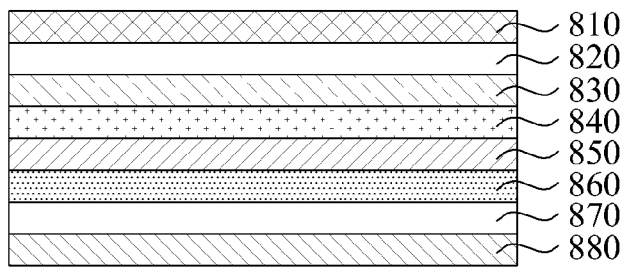
FIG. 8 is a diagram illustrating another example of a BAWR.

FIG. 8 illustrates another example of a BAWR.

Referring to FIG. 8, the BAWR includes a protective layer 810, a TCF compensation layer 820, a second electrode 830, a piezoelectric layer 840, a first electrode 850, an insulating layer 860, a TCF compensation layer 870, and a membrane 880.

For example, the TCF compensation layer 820 and the TCF compensation layer 870 may be formed of a carbon-based material. As an example, the TCF compensation layer 820 may be formed of graphene, and the TCF compensation layer 870 may be formed of CNT. The TCF compensation layer 820 and the TCF compensation layer 870 may compensate for TCFs of the second electrode 830, the piezoelectric layer 840, the first electrode 850, and/or the membrane 880. In this example, at least one of the second electrode 830, the piezoelectric layer 840, and the first electrode 850 may be formed of a carbon-based material.

The TCF compensation layer 820 and the TCF compensation layer 870 may balance the TCFs of the second electrode 830, the piezoelectric layer 840, the first electrode 850, and the membrane 880 and thus, may enable a TCF of the BAWR to be close to zero.

The TCF compensation layer 870 may affect the first electrode 850 when the TCF compensation layer 870 has an electrical characteristic of a conductor. Accordingly, the insulating layer 860 may be disposed between the first electrode 850 and the TCF compensation layer 870, and may separate electrical characteristics of the first electrode 850 and the TCF compensation layer 870. The insulating layer 860 may be formed of a silicon oxide-based material, a silicon nitride based material, and AlN-based material.

Although FIG. 8 illustrates that the TCF compensation layer 820 is disposed below the protective layer 810, the TCF compensation layer 820 may be disposed on the protective layer 810. Although FIG. 8 illustrates that the TCF compensation layer 870 is disposed on the membrane 880, the TCF compensation layer 870 may be disposed below the membrane 880.

Figure 9:
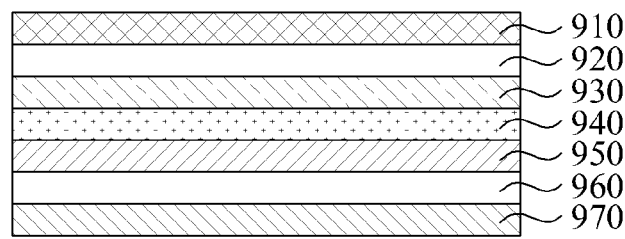
FIG. 9 is a diagram illustrating another example of a BAWR.

FIG. 9 illustrates another example of a BAWR.

Referring to FIG. 9, the BAWR includes a protective layer 910, a TCF compensation layer 920, a second electrode 930, a piezoelectric layer 940, a first electrode 950, a TCF compensation layer 960, and a membrane 970.

For example, the TCF compensation layer 920 and the TCF compensation layer 960 may be formed of a carbon-based material. As an example, the TCF compensation layer 920 may be formed of graphene, and the TCF compensation layer 960 may be formed of a CNT compound. The TCF compensation layer 920 and the TCF compensation layer 960 may compensate for TCFs of the protective layer 910, the second electrode 930, the piezoelectric layer 940, the first electrode 950, and/or the membrane 970. In this example, at least one of the second electrode 930, the piezoelectric layer 940, and the first electrode 950 may be formed of a carbon-based material.

The TCF compensation layer 920 and the TCF compensation layer 960 may balance the TCFs of the second electrode 930, the piezoelectric layer 940, the first electrode 950, and the membrane 970, and thus, may enable a TCF of the BAWR to be close to zero.

Although FIG. 9 illustrates that the TCF compensation layer 920 is disposed below the protective layer 910, the TCF compensation layer 920 may be disposed on the protective layer 910. Although FIG. 9 illustrates that the TCF compensation layer 960 is disposed on the membrane 970, the TCF compensation layer 960 may be disposed below the membrane 970.

Figure 10:
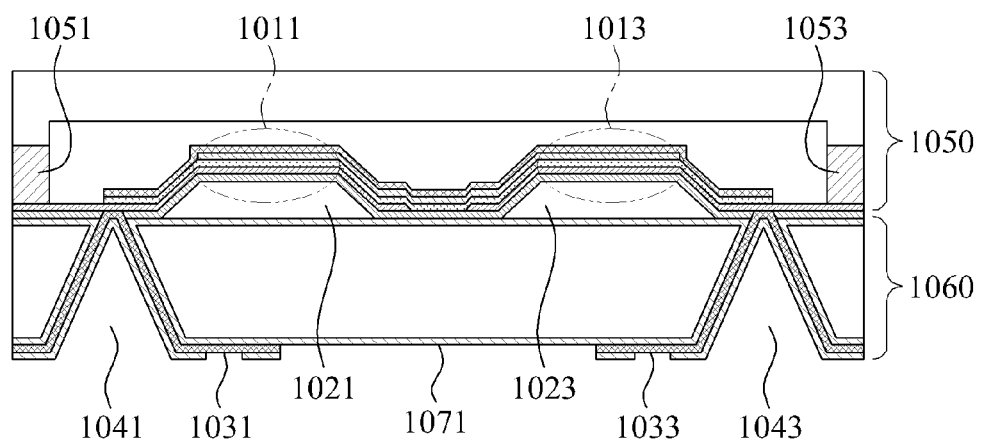
FIG. 10 is a diagram illustrating a cross-sectional view of an example of an RF device including a BAWR.

FIG. 10 illustrates a cross-sectional view of an example of an RF device including a BAWR.

Referring to FIG. 10, the RF device includes a first BAWR 1011, a second BAWR 1013, a first substrate 1060, a second substrate 1050, a via-hole 1041, and a via-hole 1043.

The RF device including the first BAWR 1011 and the second BAWR 1013, ma operate as a filter, an oscillator, a duplexer, a transmitter, a receiver, and the like.

The first BAWR 1011 includes a first lower portion electrode, a first piezoelectric layer, and a first upper portion electrode, which are layered on a first air cavity 1021. For example, the first air cavity 1021 may be disposed on the first substrate 1060. In various aspects, at least one of the first lower portion electrode, the first piezoelectric layer, and the first upper portion electrode may be formed of a carbon-based material. The carbon-based material may include at least one of CNT, graphene, a CNT compound, and a graphene compound, and the like. The graphene may be used as a single layer or a multi-layer.

As an example, the first lower portion electrode and the first upper portion electrode may be formed of graphene, and the first piezoelectric layer may be formed of ZnO, AlN, quartz, and the like.

The second BAWR 1013 includes a second lower portion electrode, a second piezoelectric layer, and a second upper portion electrode, which are layered on a second air cavity 1023. The second air cavity 1023 may be disposed on the first substrate 1060. In various aspects, at least one of the second lower portion electrode, the second piezoelectric layer, and the second upper portion electrode may be formed of a carbon-based material.

A via-hole 1041 and a via-hole 1043 may be formed on the first substrate 1060. The via-hole 1041 may penetrate the first substrate 1060 and may become a path through which the first lower portion electrode is connected to an external electrode. A protective layer 1071 may be layered below the via-hole 1041 and the first substrate 1060. The protective layer 1071 may protect the first substrate 1060 during a process of generating the via-hole 1041. The first lower portion electrode may be connected to the external electrode through a package electrode 1031 layered on the protective layer 1071.

The via-hole 1043 may penetrate the first substrate 1060 and may become a path through which the second lower portion electrode is connected to an external electrode. The protective layer 1071 may be layered below the via-hole 1043 and the first substrate 1060. The protective layer 1071 may protect the first substrate 1060 during a process of generating the via-hole 1043. The second lower portion electrode may be connected to the external electrode through a package electrode 1033 layered on the protective layer 1071. For example, the package electrode 1031 and the package electrode 1033 may be formed of a carbon-based material.

The second substrate 1050 may include an air cavity formed on a predetermined area of a lower surface of the second substrate 1050. In this example, the air cavity of the second substrate 1050 is large enough such that the first BAWR 1011 and the second BAWR 1013 may be received therein. The second substrate 1050 may be in a contact with the first substrate 1060 using a bonding metal 1051 and a bonding metal 1053.

Figure 11:
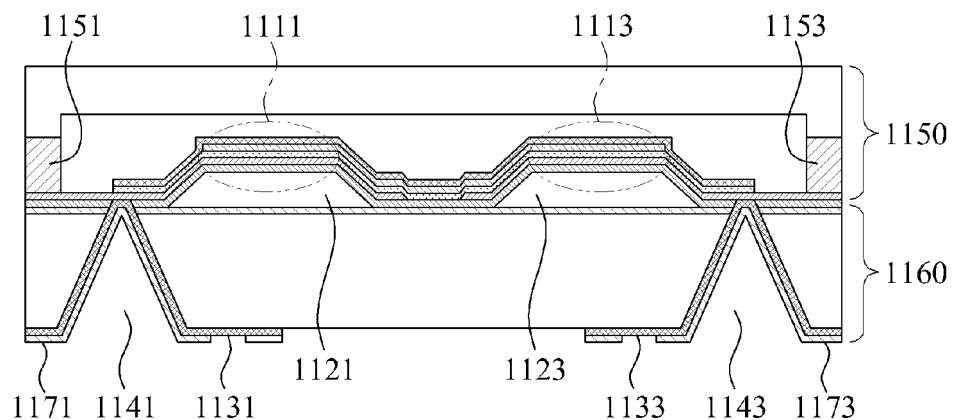
FIG. 11 is a diagram illustrating a cross-sectional view of another example of an RF device including a BAWR.

FIG. 11 illustrates a cross-sectional view of another example of an RF device including a BAWR.

Referring to FIG. 11, the RF device includes a first BAWR 1111, a second BAWR 1113, a first substrate 1160, a second substrate 1150, a via-hole 1141, and a via-hole 1143. For example, the RF device may operate as a component of a wireless communication device using the first BAWR 1111 and the second BAWR 1113.

The first BAWR 1111 includes a first lower portion electrode, a first piezoelectric layer, and a first upper portion electrode, which are layered on a first air cavity 1121. The first air cavity 1121 may be disposed on the first substrate 1160. In various aspects, at least one of the first lower portion electrode, the first piezoelectric layer, and the first upper portion electrode may be formed of a carbon-based material. For example, the carbon-based material may include at least one of CNT, graphene, a CNT compound, a graphene compound, and the like. The graphene may be used as a single layer or a multi-layer.

As an example, the first lower portion electrode and the first upper portion electrode may be formed of CNT, and the first piezoelectric layer may be formed of ZnO, AlN, quartz, and the like.

The second BAWR 1113 includes a second lower portion electrode, a second piezoelectric layer, and a second upper portion electrode, which are layered on a second air cavity 1123. The second air cavity 1123 is disposed on the first substrate 1160. In various aspects, at least one of the second lower portion electrode, the second piezoelectric layer, and the second upper portion electrode may be formed of a carbon-based material.

A via-hole 1141 and a via-hole 1143 are formed on predetermined areas of the first substrate 1160, respectively. Here, the first substrate 1160 may be a substrate that has a high resistance characteristic.

The via-hole 1141 may penetrate the first substrate 1160 and may become a path through which the first lower portion electrode is connected to an external electrode. A protective layer may not be layered in an example in which the first substrate 1160 has a high resistance characteristic, because the first substrate 1160 may not be damaged during a process of generating the via-hole 1141. The first lower portion electrode may be connected to an external electrode through a package electrode 1131 layered on a conductive layer.

The via-hole 1143 may penetrate the first substrate 1160 and may become a path through which the second lower portion electrode is connected to an external electrode. Because the first substrate 1160 has a high resistance characteristic, the second lower portion may be connected to the external electrode through a package electrode 1133 layered on a conductive layer.

In this example, a protective layer 1171 and a protective layer 1173 are layered below the conductive layers, respectively, so as to protect the conductive layers from an external environment. For example, the protective layer 1171 and the protective layer 1173 may be formed of a carbon-based material. Also, the package electrode 1131 and the package electrode 1133 may be formed of a carbon-based material.

The second substrate 1150 includes an air cavity formed on a lower surface of the second substrate 1150. The air cavity of the second substrate 1150 is large enough such that the first BAWR 1111 and the second BAWR 1113 may be received therein. The second substrate 1150 may be in a contact with the first substrate 1160 using a bonding metal 1151 and a bonding metal 1153, the second substrate 1150 being in a state of a wafer.

In various aspects, a BAWR includes an electrode which is formed of a carbon-based material and thus, energy loss of an RF device, a heat characteristic, and a quality factor of the BAWR may be improved.

In various aspects, a BAWR includes a piezoelectric layer or a TCF compensation layer which is formed of a carbon-based material, and thus, a size of the BAWR may be reduced and a heat characteristic may be improved.

In various aspects, a thickness of an electrode may be reduced through use of a carbon-based material and may improve an accuracy of patterning of an electrode, and thus, development of a nano sized resonator is possible.

If a resonator includes a capacitor that has a dielectric substance and that is inserted between electrodes, an accuracy of capacitance measured may increase, and thus, a characteristic of an RF filter including a plurality of BAWRs may be improved.

A process margin may be increased as an accuracy of a process is increased, and thus, a number of BAWRs yielded through a manufacturing process may be improved.

As a non-exhaustive illustration only, a terminal/device/unit described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer. It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A bulk acoustic wave resonator (BAWR), comprising:
a membrane disposed on an air cavity;
a first electrode disposed on the membrane;
a piezoelectric layer disposed on the first electrode;
a second electrode disposed on the piezoelectric layer, wherein at least one of the first electrode, the piezoelectric layer, and the second electrode comprises a carbon-based material, and the air cavity is formed on an upper surface of a substrate; and
a temperature coefficient of frequency (TCF) compensation layer to compensate for a TCF of the first electrode, the piezoelectric layer, and the second electrode, wherein the TCF compensation layer comprises a carbon-based material.

2. The BAWR of claim 1, wherein the carbon-based material comprises a carbon nano tube (CNT), a CNT compound, graphene, and a graphene compound.

3. The BAWR of claim 2, wherein the graphene is disposed as a single layer or a multi-layer.

4. The BAWR of claim 1, further comprising:
a protective layer that is disposed on the second electrode to protect the second electrode from an external environment.

5. The BAWR of claim 1, wherein the TCF compensation layer is disposed below the membrane or on the second electrode.

6. The BAWR of claim 1, wherein the TCF compensation layer is disposed between the first electrode and the membrane.

7. The BAWR of claim 1, further comprising:
an insulating layer that is disposed between the first electrode and the TCF compensation layer to separate electrical characteristics of the first electrode and the TCF compensation layer.

8. The BAWR of claim 1, further comprising:
an insulating layer that is disposed between the second electrode and the TCF compensation layer to separate electrical characteristics of the second electrode and the TCF compensation layer.

9. The BAWR of claim 4, further comprising:
a TCF compensation layer to compensate for a TCF of the first electrode, the piezoelectric layer, and the second electrode,
wherein the TCF compensation layer comprises a carbon-based material and is disposed on or below the protective layer.

10. A radio frequency (RF) device including a bulk acoustic wave resonator (BAWR), the RF device comprising:
a first substrate;
a first BAWR comprising a first air cavity formed on the first substrate, and a first lower portion electrode, a first piezoelectric layer, and a first upper portion electrode which are layered on the first air cavity;
a second BAWR comprising a second air cavity formed on the first substrate, and a second lower portion electrode, a second piezoelectric layer, and a second upper portion electrode which are layered on the second air cavity,
wherein at least one of the first lower portion electrode, the first piezoelectric layer, the first upper portion electrode, the second lower portion electrode, the second piezoelectric layer, and the second upper portion electrode comprises a carbon-based material wherein the first air cavity and the second air cavity are formed on an upper surface of the first substrate;
a protective layer layered below the via-holes and the first substrate; and
a package electrode layered below the protective layer.

11. The RF device of claim 10, wherein the carbon-based material comprises a carbon nano tube (CNT), a CNT compound, graphene, and a graphene compound.

12. The RF device of claim 10, further comprising:
a second substrate comprising an air cavity formed on a predetermined area of a lower surface and connected to the first substrate.

13. The RF device of claim 10, wherein the package electrode comprises at least one of a CNT, a CNT compound, graphene, and a graphene compound.

14. The RF device of claim 10, further comprising:
via-holes formed at locations on the first substrate, the locations corresponding to a predetermined area of the first lower portion electrode and a predetermined area of the second upper portion electrode.

15. The RF device of claim 10, further comprising:
a package electrode layered below the via-holes and the first substrate, wherein the first substrate has a high resistance characteristic; and
a protective layer layered below the package electrode.

16. The RF device of claim 15, wherein the protective layer comprises at least one of a carbon nano tube (CNT), a CNT compound, graphene, and a graphene compound.

17. A bulk acoustic wave resonator (BAWR), comprising:
- a first electrode and a second electrode;
- a piezoelectric oscillation layer operably coupled to both the first and second electrodes; and
- a temperature coefficient of frequency (TCF) compensation layer to compensate for a TCF of the first electrode, the piezoelectric oscillation layer, and the second electrode,
- wherein the TCF compensation layer, the first electrode, the piezoelectric oscillation layer, and the second electrode comprises a carbon-based material.

18. The BAWR of claim 17 wherein the TCF compensation layer compensates for a combined TCF of the first electrode, the piezoelectric layer, and the second electrode to have a substantially zero TCF.

19. The BAWR of claim 17 wherein the first electrode and the second electrode extend in interleaved manner in opposing directions from respectively corresponding via holes disposed through a substrate.

* * * * *